United States Patent
Sirkis et al.

(10) Patent No.: US 10,840,128 B2
(45) Date of Patent: Nov. 17, 2020

(54) SEMICONDUCTOR DEVICE HAVING A RADIO FREQUENCY CIRCUIT AND A METHOD FOR MANUFACTURING THE SEMICONDUCTOR DEVICE

(71) Applicant: Tower Semiconductor LTD., Migdal Haemek (IL)

(72) Inventors: Alex Sirkis, Yokneam Illit (IL); Alexey Heiman, Ramat Ishay (IL); Yakov Roizin, Afula (IL)

(73) Assignee: Tower Semiconductors Ltd., Migdal Haemek (IL)

( * ) Notice: Subject to any disclaimer, the term of this patent is extended or adjusted under 35 U.S.C. 154(b) by 0 days.

(21) Appl. No.: 16/246,550

(22) Filed: Jan. 14, 2019

(65) Prior Publication Data
US 2020/0227309 A1    Jul. 16, 2020

(51) Int. Cl.
*H01L 21/762*    (2006.01)
*H01L 21/3065*    (2006.01)
*H01L 27/12*    (2006.01)

(52) U.S. Cl.
CPC .... *H01L 21/76264* (2013.01); *H01L 27/1203* (2013.01); *H01L 21/30655* (2013.01)

(58) Field of Classification Search
CPC .......... H01L 27/1203; H01L 21/76264; H01L 21/30655
See application file for complete search history.

(56) References Cited

U.S. PATENT DOCUMENTS

| | | | |
|---|---|---|---|
| 2017/0330832 A1* | 11/2017 | He | H01L 23/5222 |
| 2019/0019687 A1* | 1/2019 | Rouviere | H01L 21/78 |
| 2019/0312142 A1* | 10/2019 | Adusumilli | H01L 29/78603 |

* cited by examiner

*Primary Examiner* — Christine A Enad
(74) *Attorney, Agent, or Firm* — Reches Patent

(57) ABSTRACT

A method for manufacturing a semiconductor device, the method may include forming a first part of a hollow in first part of a first layer of the semiconductor device and coating a sidewall of the first part of the hollow with an etch stop material, wherein the forming of the first part of the hollow comprises performing at least one iteration of (i) anisotropic etching and (ii) deposition of the etch stop material; wherein when completed, the semiconductor device comprises a radio frequency (RF) circuit; forming a second part of the hollow in a second part of the first layer by performing isotropic etching that involves directing plasma through the first part of the hollow; wherein the second part of the hollow reaches either (a) a bottom of a second layer of the semiconductor device or (b) the RF circuit; and wherein at least a majority of the second part of the hollow is wider than at least a majority of the first part of the hollow.

18 Claims, 9 Drawing Sheets

102

SEMICONDUCTOR DEVICE HAVING A RADIO FREQUENCY CIRCUIT AND A METHOD FOR MANUFACTURING THE SEMICONDUCTOR DEVICE

BACKGROUND OF THE INVENTION

A silicon on oxide (SOI) device may include one or more device layers that are formed over an oxide layer that in turn is formed on a silicon substrate (also known as substrate handle). Radio Frequency (RF) circuits (such as RF amplifiers, RF antenna switches) may be formed in the device layers.

The oxide layer provides electrical isolation of the SOI device. Nevertheless, significant RF losses and cross-talks between the components still occur because of the capacitive coupling through the oxide layer. Parasitic effects are enhanced due to surface conductivity of the substrate handle which contacts with the oxide layer.

There is a growing need to improve the performance of the SOI device—for example by reducing RF losses.

SUMMARY

According to an embodiment of the invention there may be provided a system that may include There may be provided a method for manufacturing a semiconductor device, the method may include forming a first part of a hollow in first part of a first layer of the semiconductor device and coating a sidewall of the first part of the hollow with an etch stop material, wherein the forming of the first part of the hollow may include performing at least one iteration of (i) anisotropic etching and (ii) deposition of the etch stop material; wherein when completed, the semiconductor device may include a radio frequency (RF) circuit; and forming a second part of the hollow in a second part of the first layer by performing isotropic etching that involves directing plasma through the first part of the hollow; wherein the second part of the hollow reaches either (a) a bottom of a second layer of the semiconductor device or (b) the RF circuit; and wherein at least a majority of the second part of the hollow may be wider than at least a majority of the first part of the hollow.

The method may include passivating the hollow.

The method may include sealing the hollow.

The upper part of the hollow may be substantially radially symmetrical and has curved sidewalls.

Each one of the the anisotropic etching and the isotropic etching may include using plasma that may include sulfur hexafluoride ions, and wherein the deposition may include using plasma that may include Octafluorocyclobutane ions.

The first layer may be a device layer.

The second part of the hollow reaches the RF circuit.

The forming of the hole may be preceded by forming an opening in an oxide region formed on the device layer.

The forming of the second part of the hollow may be followed by forming the RF circuit.

The forming of the first part of the hollow may be preceded by forming the RF circuit.

The method may include forming multiple spaced apart hollows in the semiconductor device.

The device layer may be formed on an oxide layer of the semiconductor device, and wherein the oxide layer may be formed on a substrate of the semiconductor device.

The device layer may be a part of a stack of layers that may include one or more gallium nitride layers and an aluminum nitride layer.

The thickness of each gallium nitride layer may range between 0.5 microns to 5 microns, and wherein a thickness of the aluminum nitride layer may range between 100 nanometers and 200 nanometers.

The first layer may be a substrate of the semiconductor device, wherein the forming of the first part may include forming the first part of the hollow at a backside of the substrate, wherein the second layer may be an oxide layer positioned above the substrate; and wherein the RF circuit may be formed above the oxide layer.

The second part of the hollow reaches the oxide layer.

The forming of the first part of the hollow may be preceded by forming a hole in an etch stop mask that may be formed on a backside of the substrate; and wherein the forming of the first part of the hollow may include directing plasma through the hole of the etch mask.

The thickness of the substrate may range between 0.2 microns to 2 microns and wherein a thickness of the oxide layer may range between 0.1 microns to microns.

The forming of the second part of the hollow may include using the oxide layer as an etch stop.

The forming of the first part of the hollow may be preceded by thinning the substrate.

The area of a widest portion of the second part of the hollow may range between 10 microns to 500 microns.

The area of the cross section of the hole may range between 25 microns to 350 microns.

The method may include forming multiple spaced apart hollows in the substrate.

There may be provided a semiconductor device that may include a radio frequency (RF) circuit, a first layer and a hollow; wherein the semiconductor device may be manufactured by a method the may include: forming a first part of the hollow in first part of the first layer and coating a sidewall of the first part of the hollow with an etch stop material, wherein the forming of the first part of the hollow may include performing at least one iteration of (i) anisotropic etching and (ii) deposition of the etch stop material; forming a second part of the hollow in a second part of the first layer by performing isotropic etching that involves directing plasma through the first part of the hollow; wherein the second part of the hollow reaches either (a) a bottom of a second layer of the semiconductor device or (b) the RF circuit; and wherein at least a majority of the second part of the hollow may be wider than at least a majority of the first part of the hollow.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

Figure 1:
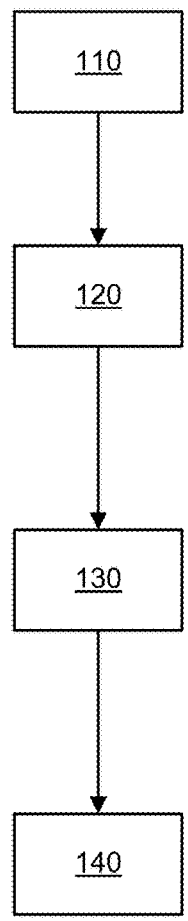
FIG. 1 is example of a method.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

DESCRIPTION OF THE PREFERRED EMBODIMENTS

In the following detailed description, numerous specific details are set forth in order to provide a thorough understanding of the invention. However, it will be understood by those skilled in the art that the present invention may be practiced without these specific details. In other instances, well-known methods, procedures, and components have not been described in detail so as not to obscure the present invention.

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings.

Because the illustrated embodiments of the present invention may for the most part, be implemented using electronic components and circuits known to those skilled in the art, details will not be explained in any greater extent than that considered necessary as illustrated above, for the understanding and appreciation of the underlying concepts of the present invention and in order not to obfuscate or distract from the teachings of the present invention.

There may be provided a semiconductor device and method for manufacturing a semiconductor device. The method may include forming one or more hollows below one or more RF circuits thereby increasing the isolation of the one or more RF circuit.

The one or more hollow are formed while maintaining the mechanical integrity of the semiconductor device—while providing an adequate mechanical support to the one or more RF circuits—even when the RF circuits are relatively large. A majority (for example about 90%) of a handle may be maintained. Other percentages of the handle may be maintained (for example 50, 60, 70, 80 percent and the like).

The one or more hollows may be substantially empty—and there is no need to fill the one or more hollows with trap-rich materials—thereby simplifying the manufacturing process and reducing the cost of the manufacturing process.

The hollows may be relatively deep and provide a much better isolation than shallow trenches formed around the RF circuit.

The manufacturing process may not require to transfer of the SOI device layer with fabricated RF circuits onto a dielectric substrate—thereby increasing the yield of the manufacturing process and simplifying the manufacturing process and reducing the cost of the manufacturing process.

Multiple hollows may form multiple gaps below the one or more RF circuits or below an oxide layer (that in turn is located below the one or more RF circuits). The hollow have a first part that is relatively narrow and a second part that is much wider.

Multiple spaced apart hollows that are formed in a layer (for example in a substrate handle) may define regions of the layer that are positioned between the hollows—and form supporting pillars—each supporting pillar having a base that is much wider than the top of the supporting pillar.

While the RF circuit may span across an area of millimetric dimensions the hollows may be much smaller—and an array (dense or not) of hollows may be provided. When maintaining a small distance between the hollows—the support to the one or more RF circuits is more reliable.

FIG. 1 illustrates method 100 for manufacturing a semiconductor device.

Method 100 may start by preliminary step 110.

Preliminary step 110 may include at least one out of (i) thinning a substrate of the semiconductor device, (ii) forming an etch stop mask on a backside of the substrate, and the like.

Preliminary step 110 may be followed by step 120 of forming a first part of a hollow in first part of the substrate and coating a sidewall of the first part of the hollow with an etch stop material.

The substrate may be a semiconductor substrate (especially but not limited to a silicon substrate) that is formed below an oxide layer. The oxide layer may be formed below one or more device layers that may include the radio frequency (RF) circuit.

Step 120 may include performing at least one iteration of (i) anisotropic etching and (ii) deposition of the etch stop material. For example—multiple iterations of (i) and (ii) may be executed—one iteration for each section of the first part of the hollow.

Step 120 may include applying a deep reactive-ion etching (DRIE) such as the Bosch process. (See, for example U.S. Pat. Nos. 5,501,893, 6,531,068 and 6,284,148).

The anisotropic etching and the isotropic etching may include using plasma that includes sulfur hexafluoride ions. The deposition may include using plasma that includes Octafluorocyclobutane ions.

The first part of the hollow may be a narrow hole and may have a high aspect ratio. A high aspect ratio may exceed 1:10, 1:20, 1:30 and the like. For example—an aspect ratio of 1:35 (one to 35)-5 um width and 175 um depth or 10 um width and 350 um depth, etc.). The width or radius of the hole may be of micron scale.

Step 120 may be followed by step 130 of forming a second part of the hollow in a second part of substrate by performing isotropic etching that involves directing plasma through the first part of the hollow. The second part of the hollow may reach a bottom of the oxide layer.

The hollow provides a gap below the oxide layer while maintaining the mechanical integrity of the semiconductor device—thereby allowing the substrate to support the oxide layer and the RF circuit.

The area of a widest portion of the second part of the hollow may range between 10 microns to 500 microns.

The area of the cross section of the hole ranges between 25 microns to 350 microns. The cross section may be taken along a plane that is normal to a longitudinal axis of the hollow.

The first part of the hollow may have a rectangular or a circular cross section.

Step 130 may be followed by additional step 140.

The additional step 140 may include at least one out of passivating the hollow, sealing the hollow, and the like.

The sealing can be done using, for example, resins or epoxy. The passivation can make the surfaces of hollow hydrophobic and thus exclude effects connected with water ions migration. This can be done by treating in HMDS (hexamethyldisilazane) vapors before sealing.

It should be noted that method 100 may include forming multiple hollows—such as an array of spaced apart hollows. The hollows may be arranged in any formation (ordered or non-ordered). The multiple hollows can be manufactured one after the other, or simultaneously.

The second part of the hollow may be substantially radially symmetrical and may have curved sidewalls—for example—it may have a shape that resembles an onion.

Figure 2:
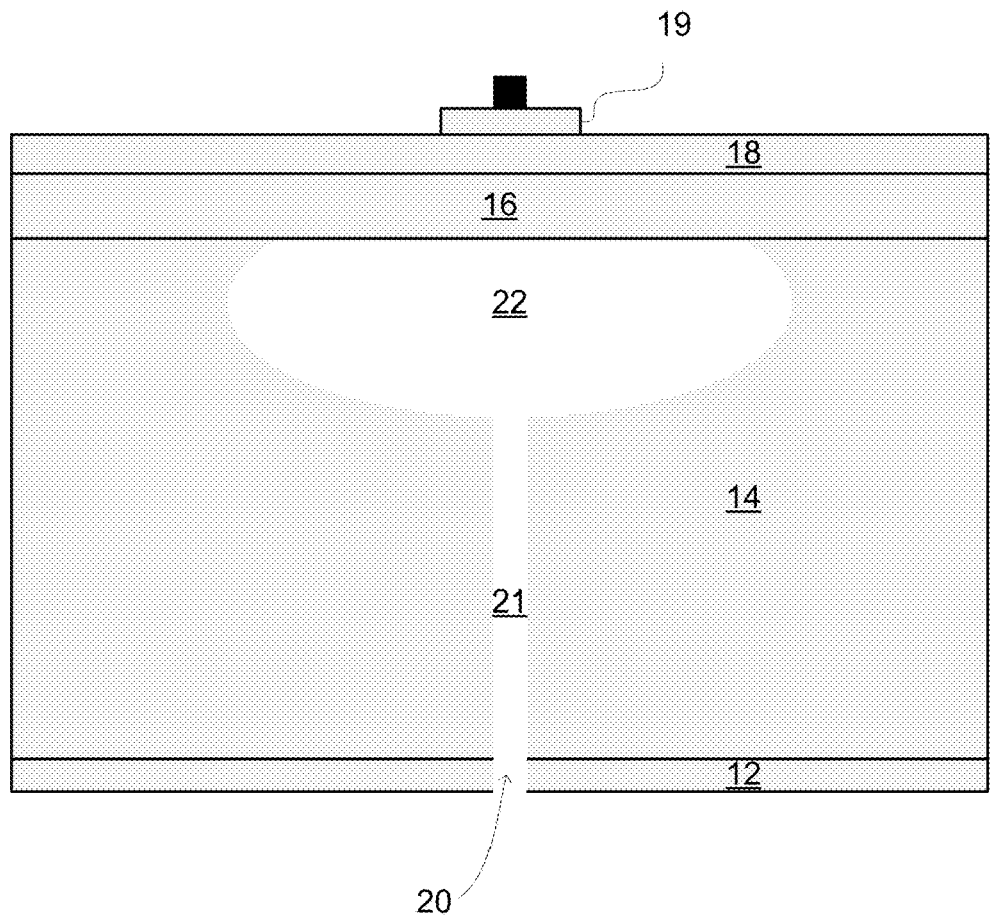
FIG. 2 is example of a part of a semiconductor device.

FIG. 2 illustrates a cross section of a part of a semiconductor device 10 that includes mask 12, substrate 14, oxide layer 16, an RF circuit 19 such as an RF switch transistor formed in a device layer 18, and hollow 20 that is formed in the substrate 14.

The first part of the hollow is denoted 21. The second part of the hollow is denoted 22.

Figure 3:
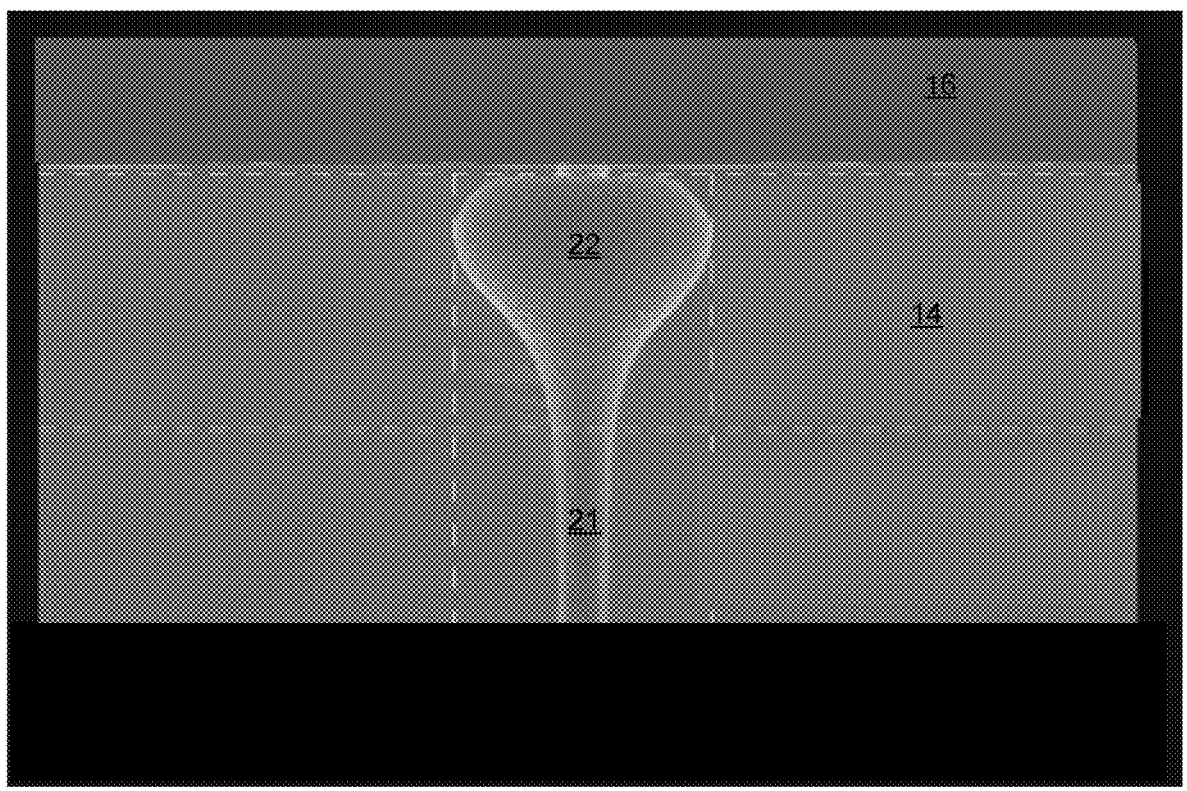
FIG. 3 is example of a part of a semiconductor device.

FIG. 3 illustrates an hollow (first part denoted 21, second part denoted 22) formed in the substrate 14. The hollow reaches oxide layer 16.

Figure 4:
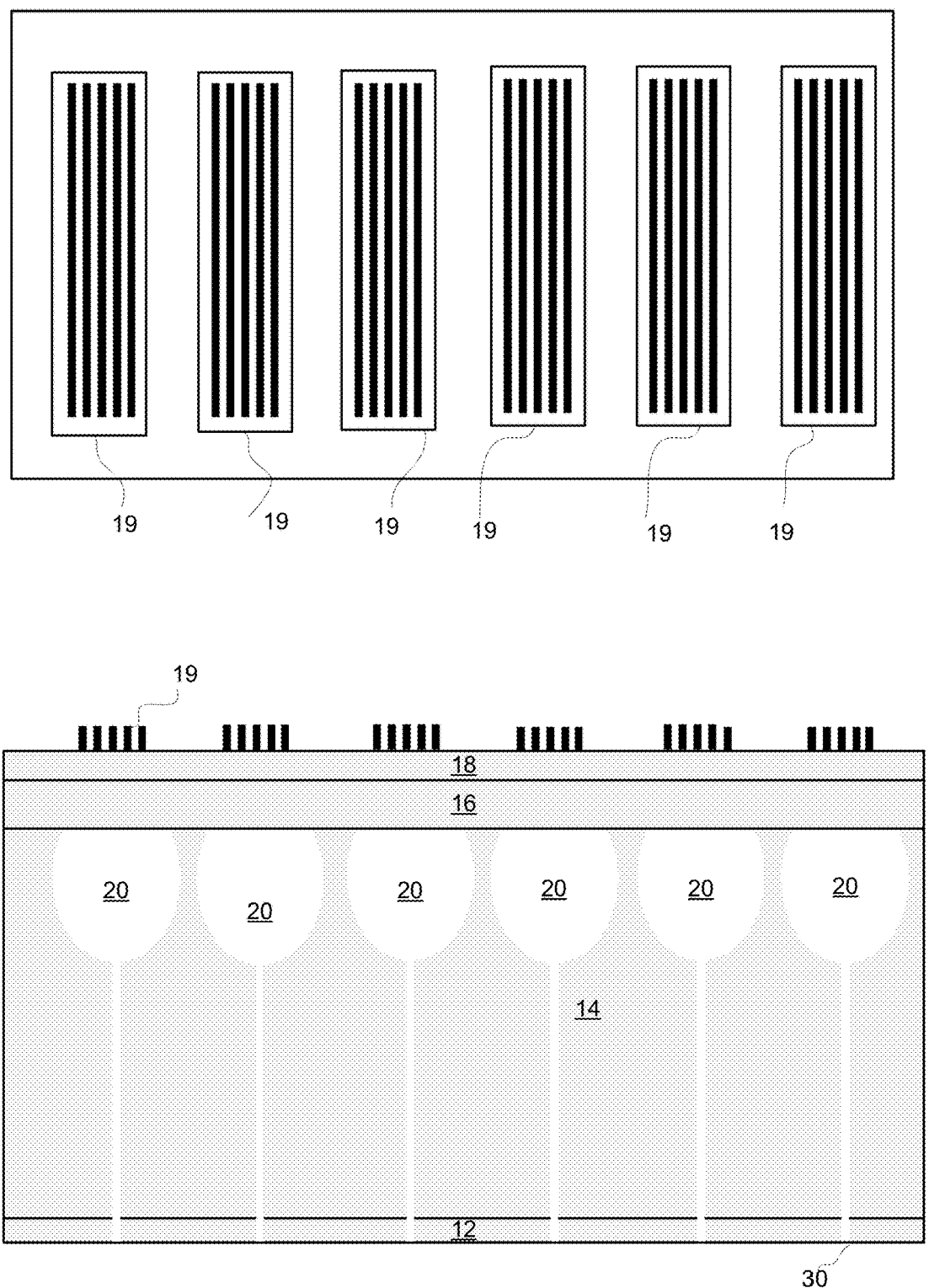
FIG. 4 is example of a part of a semiconductor device.

FIG. 4 includes a top view of a part 10 of a semiconductor device that includes RF circuits 19 such as multiple RF transistors, each RF transistor includes multiple fingers.

FIG. 4 also illustrates a cross sectional view of the part 10 of the semiconductor device that includes RF circuits 19 such as multiple RF transistors. The multiple RF transistors are positioned within a layer device (not shown)—above oxide layer 16, above substrate 14, and above mask 12. Multiple hollows 20 are formed below the multiple RF transistors. The bottoms of the hollows are sealed by seal 30.

Figure 5:
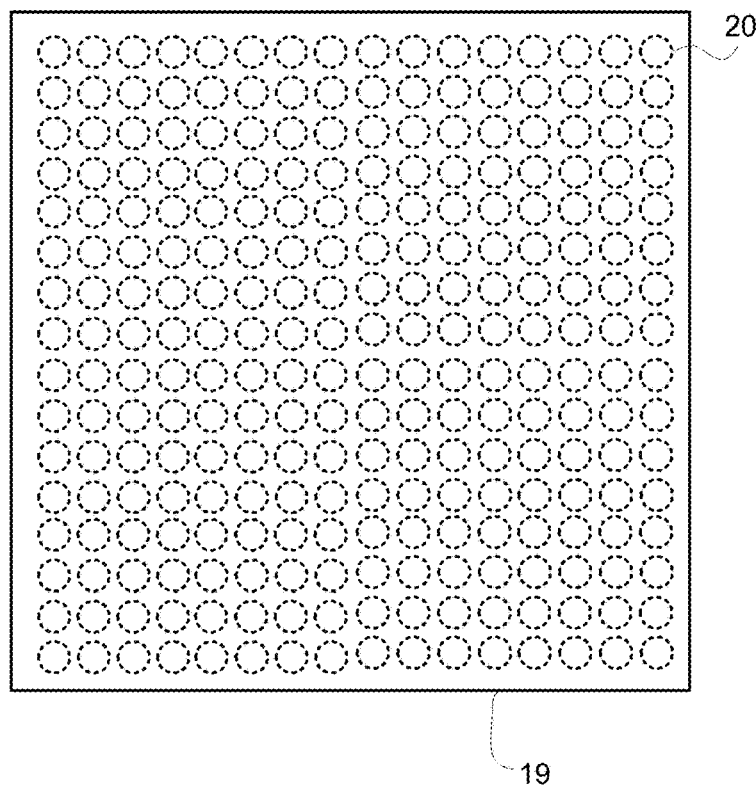
FIG. 5 is example of a part of a semiconductor device.

FIG. 5 is a top view of a RF circuit 19 and multiple hollows 20 formed below the RF circuit 19.

Figure 6:
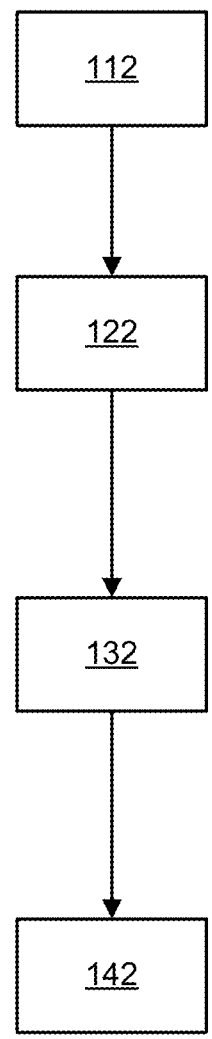
FIG. 6 is example of a method.

FIG. 6 illustrates method 102 for manufacturing a semiconductor device.

Method 102 may start by preliminary step 112.

Preliminary step 112 may include forming an an etch stop mask on a device layer. The device layer may be a part of one or more layers that include the RF circuit.

Preliminary step 112 may be followed by step 122 of forming a first part of a hollow in a first part of the device layer and coating a sidewall of the first part of the hollow with an etch stop material.

The device layer may be formed above an oxide layer. The oxide layer may be formed above a substrate such as a semiconductor substrate.

The device layer may be a part of a stack of layers that include one or more gallium nitride layers and an aluminum nitride layer.

A thickness of each gallium nitride layer may range between 0.5 microns to 5 microns. A thickness of the aluminum nitride layer may range between 100 nanometers and 200 nanometers Step 122 may include performing at least one iteration of (i) anisotropic etching and (ii) deposition of the etch stop material.

For example—multiple iterations of (i) and (ii) may be executed—one iteration for each section of the first part of the hollow.

Step 122 may include applying a deep reactive-ion etching (DRIE) such as the Bosch process. (See, for example U.S. Pat. Nos. 5,501,893, 6,531,068 and 6,284,148).

The anisotropic etching and the isotropic etching may include using plasma that includes sulfur hexafluoride ions. The deposition may include using plasma that includes Octafluorocyclobutane ions.

The first part of the hollow may be a narrow hole and may have a high aspect ratio. The width or radius of the hole may be of micron scale.

Step 122 may be followed by step 132 of forming a second part of the hollow in a second part of the device layer by performing isotropic etching that involves directing plasma through the first part of the hollow. The second part of the hollow may reach a bottom of the oxide layer.

The hollow provides a gap below the oxide layer while maintaining the mechanical integrity of the semiconductor device—thereby allowing the layers below the RF circuit to support the RF circuit.

Step 132 may be followed by additional step 142.

The additional step may include at least one out of passivating the hollow, sealing the hollow, and the like.

The second part of the hollow may reach the RF circuit.

The first part of the hollow may be formed between RF circuits, in gaps within the RF circuits, and the like.

Figure 7:
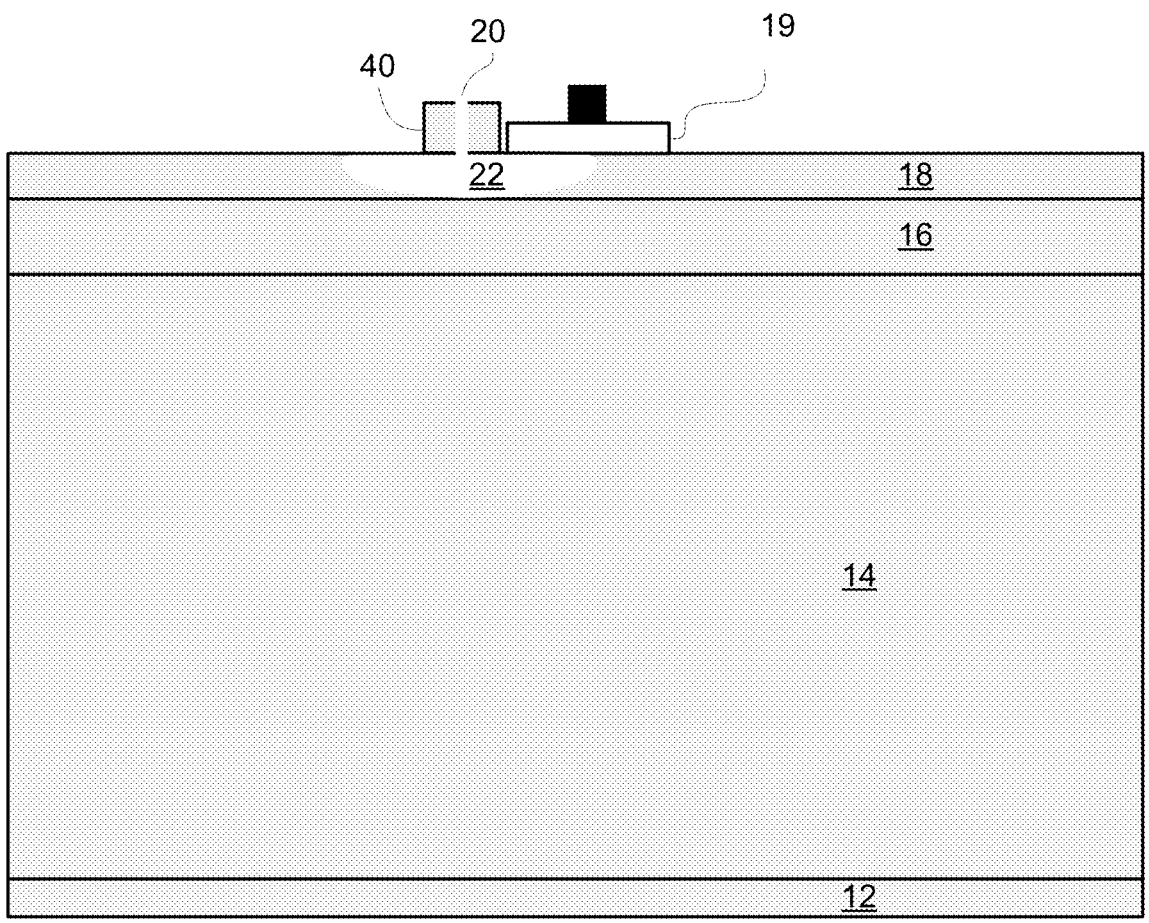
FIG. 7 is example of a part of a semiconductor device.

FIG. 7 illustrates an oxide region 40 formed above device layer 18. Hollow 20 is formed within the oxide region 40 and the device layer 18.

Figure 8:
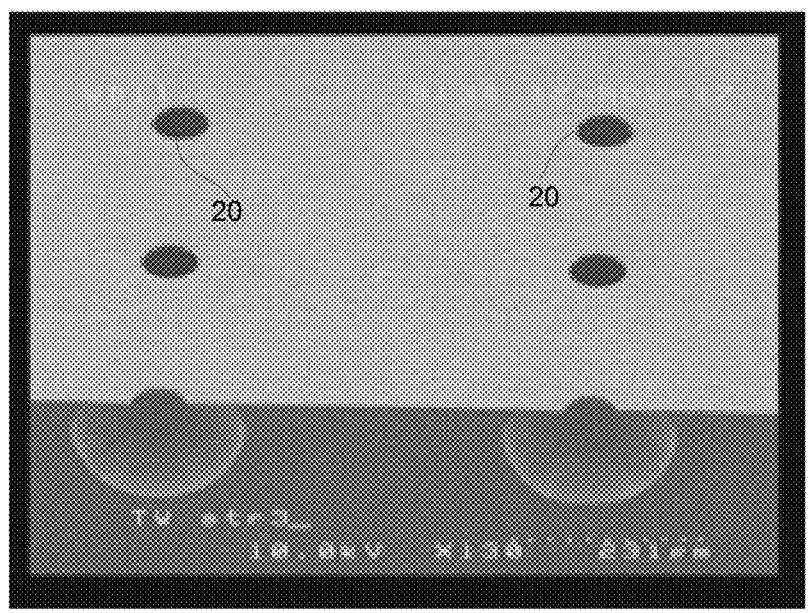
FIG. 8 is example of a part of a semiconductor device.
Figure 8:
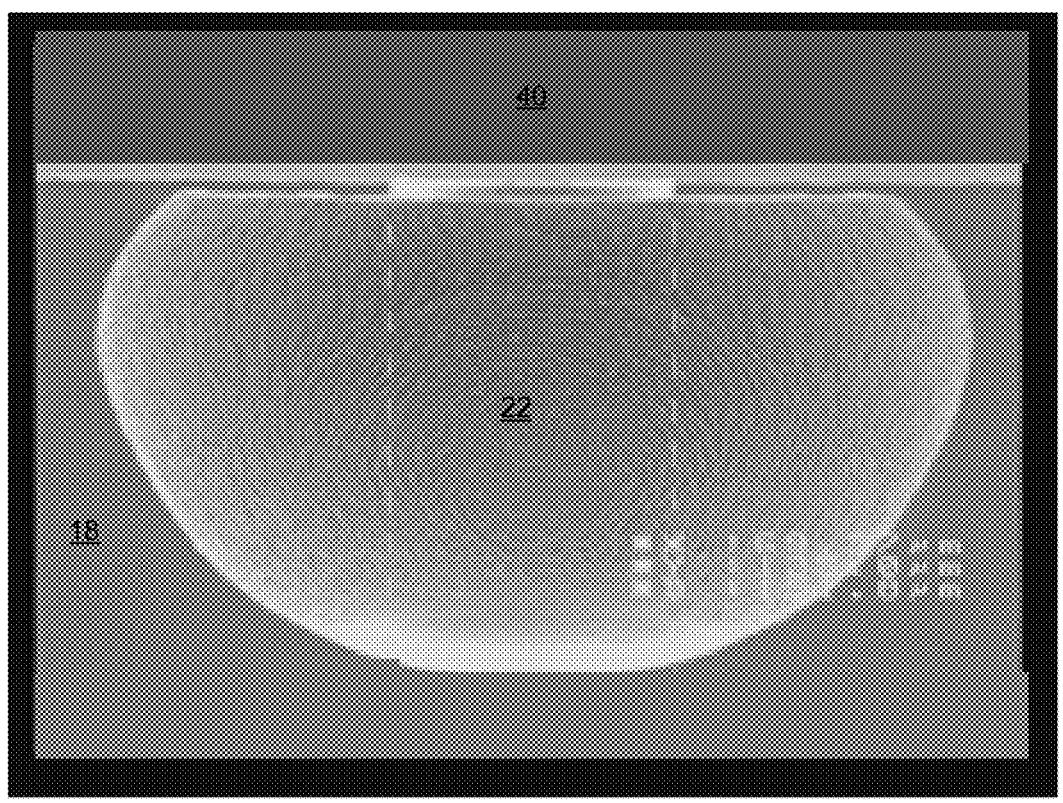

FIG. 8 illustrates top and cross sectional view of hollows 20 formed in the front (top) of the semiconductor device.

Figure 9:
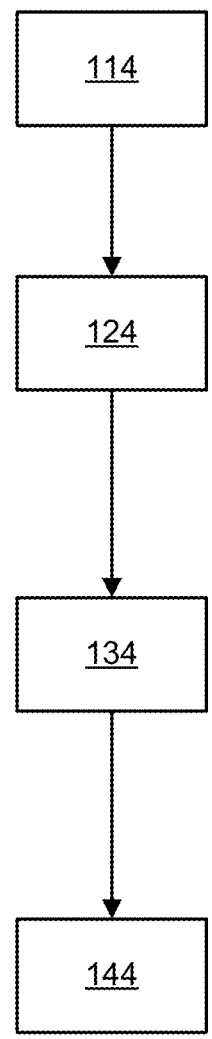
FIG. 9 is example of a method.

FIG. 9 illustrates method 104.

Method 104 may start by preliminary step 114.

Step 114 may be followed by step 124 of forming a first part of a hollow in first part of a first layer of the semiconductor device and coating a sidewall of the first part of the hollow with an etch stop material. Step 124 may include performing at least one iteration of (i) anisotropic etching and (ii) deposition of the etch stop material. When completed, the semiconductor device comprises a radio frequency (RF) circuit.

Step 124 may be followed by step 134 of forming a second part of the hollow in a second part of the first layer by performing isotropic etching that involves directing plasma through the first part of the hollow.

The second part of the hollow may reach a bottom of a second layer of the semiconductor device or the RF circuit.

At least a majority of the second part of the hollow is wider than at least a majority of the first part of the hollow.

Step 134 may be followed by additional step 144.

The additional step may include at least one out of passivating the hollow, sealing the hollow, and the like.

Any reference to any of the terms "comprise", "comprises", "comprising" "including", "may include" and "includes" may be applied to any of the terms "consists", "consisting", "consisting essentially of". For example—any of the rectifying circuits illustrated in any figure may include more components that those illustrated in the figure, only the components illustrated in the figure or substantially only the components illustrate din the figure.

In the foregoing specification, the invention has been described with reference to specific examples of embodiments of the invention. It will, however, be evident that various modifications and changes may be made therein without departing from the broader spirit and scope of the invention as set forth in the appended claims. Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures can be implemented which achieve the same functionality. Any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

Also for example, in one embodiment, the illustrated examples may be implemented as circuitry located on a single integrated circuit or within a same device. Alternatively, the examples may be implemented as any number of separate integrated circuits or separate devices interconnected with each other in a suitable manner.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements.

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the true spirit of the invention.

We claim:

1. A method for manufacturing a semiconductor device, the method comprises:
    forming a first part of a hollow in first part of a first layer of the semiconductor device and coating a sidewall of the first part of the hollow with an etch stop material, wherein the forming of the first part of the hollow comprises performing at least one iteration of (i) anisotropic etching and (ii) deposition of the etch stop material; wherein when completed, the semiconductor device comprises a radio frequency (RF) circuit;
    forming a second part of the hollow in a second part of the first layer by performing isotropic etching that involves directing plasma through the first part of the hollow; wherein the second part of the hollow reaches either (a) a bottom of a second layer of the semiconductor device or (b) the RF circuit;
    wherein at least a majority of the second part of the hollow is wider than at least a majority of the first part of the hollow;
    wherein the first layer is a device layer; and
    wherein at least one of the following is true;
    the forming of the first part of the hollow is preceded by forming the RF circuit;
    the device layer is formed on an oxide layer of the semiconductor device, and wherein the oxide layer is formed on a substrate of the semiconductor device; and
    the device layer is a part of a stack of layers that comprises one or more gallium nitride layers and an aluminum nitride layer.

2. The method according to claim 1 comprising passivating the hollow.

3. The method according to claim 1 comprising sealing the hollow.

4. The method according to claim 1 wherein the upper part of the hollow is substantially radially symmetrical and has curved sidewalls.

5. The method according to claim 1 wherein each one of the the anisotropic etching and the isotropic etching comprises using plasma that comprises sulfur hexafluoride ions, and wherein the deposition comprises using plasma that comprises Octafluorocyclobutane ions.

6. The method according to claim 1 wherein the second part of the hollow reaches the RF circuit.

7. The method according to claim 1 wherein the forming of the hole is preceded by forming an opening in an oxide region formed on the device layer.

8. The method according to claim 1 wherein the forming of the second part of the hollow is followed by forming the RF circuit.

9. The method according to claim 1 wherein the forming of the first part of the hollow is preceded by forming the RF circuit.

10. The method according to claim 1 comprising forming multiple spaced apart hollows in the semiconductor device.

11. The method according to claim 1 wherein the device layer is formed on an oxide layer of the semiconductor device, and wherein the oxide layer is formed on a substrate of the semiconductor device.

12. The method according to claim 1 wherein the device layer is a part of a stack of layers that comprises one or more gallium nitride layers and an aluminum nitride layer.

13. The method according to claim 12 wherein a thickness of each gallium nitride layer ranges between 0.5 microns to 5 microns, and wherein a thickness of the aluminum nitride layer ranges between 100 nanometers and 200 nanometers.

14. A method for manufacturing a semiconductor device, the method comprises:
    forming a first part of a hollow in first part of a first layer of the semiconductor device and coating a sidewall of the first part of the hollow with an etch stop material, wherein the forming of the first part of the hollow comprises performing at least one iteration of (i) anisotropic etching and (ii) deposition of the etch stop material; wherein when completed, the semiconductor device comprises a radio frequency (RF) circuit;
    forming a second part of the hollow in a second part of the first layer by performing isotropic etching that involves directing plasma through the first part of the hollow;
wherein the second part of the hollow reaches either (a) a bottom of a second layer of the semiconductor device or (b) the RF circuit;

wherein at least a majority of the second part of the hollow is wider than at least a majority of the first part of the hollow;

wherein the first layer is a substrate of the semiconductor device, wherein the forming of the first part comprises forming the first part of the hollow at a backside of the substrate, wherein the second layer is an oxide layer positioned above the substrate; and wherein the RF circuit is formed above the oxide layer.

15. The method according to claim 14 wherein the second part of the hollow reaches the oxide layer.

16. The method according to claim 14 wherein the forming of the first part of the hollow is preceded by forming a hole in an etch stop mask that is formed on a backside of the substrate; and wherein the forming of the first part of the hollow comprises directing plasma through the hole of the etch mask.

17. The method according to claim 14 wherein the area of the cross section of the hole ranges between 25 microns to 350 microns.

18. The method according to claim 14 comprising forming multiple spaced apart hollows in the substrate.

* * * * *